(12) United States Patent
Dedic

(10) Patent No.: US 12,166,501 B1
(45) Date of Patent: Dec. 10, 2024

(54) MUX AND DEMUX CIRCUITS WITH IMPROVED BANDWIDTH

(71) Applicant: Cisco Technology, Inc., San Jose, CA (US)

(72) Inventor: Ian Dedic, London (GB)

(73) Assignee: CISCO TECHNOLOGY, INC., San Jose, CA (US)

( * ) Notice: Subject to any disclaimer, the term of this patent is extended or adjusted under 35 U.S.C. 154(b) by 123 days.

(21) Appl. No.: 17/847,802

(22) Filed: Jun. 23, 2022

Related U.S. Application Data

(60) Provisional application No. 63/214,190, filed on Jun. 23, 2021.

(51) Int. Cl.
| | | |
|---|---|---|
| *H03M 1/66* | (2006.01) | |
| *H03K 19/013* | (2006.01) | |
| *H03M 1/82* | (2006.01) | |

(52) U.S. Cl.
CPC ........ *H03M 1/662* (2013.01); *H03K 19/0136* (2013.01); *H03M 1/822* (2013.01)

(58) Field of Classification Search
CPC ... H03M 1/662; H03M 1/822; H03K 19/0136
USPC ........................................ 341/141, 144, 155
See application file for complete search history.

(56) References Cited

U.S. PATENT DOCUMENTS

| | | | |
|---|---|---|---|
| 9,294,328 B2 | 3/2016 | Baringer et al. | |
| 10,432,237 B2* | 10/2019 | Takeuchi | H03H 7/0123 |
| 2008/0197939 A1* | 8/2008 | Mallegol | H01P 1/213 |
| | | | 333/132 |

OTHER PUBLICATIONS

PCT International Search Report and PCT Written Opinion for PCT International Application No. PCT/US2022/034717; mailing date Oct. 14, 2022; (13 pages).

* cited by examiner

*Primary Examiner* — Khai M Nguyen
(74) *Attorney, Agent, or Firm* — K&L GATES LLP

(57) ABSTRACT

A combinational circuit (e.g., multiplexer or demultiplexer) comprises a sub-circuit that comprises first and second current paths from an input of the combinational circuit to an output of the combinational circuit, such that substantially all input current at the input of the combinational circuit is conducted by the sub-circuit via the first and second current paths to the output of the combinational circuit. The first current path comprises a first inductor and a first switch; and the second current path comprises a second inductor and a second switch. The first inductor is part of an output LC transmission line of the sub-circuit; the second inductor is part of an input LC transmission line of the sub-circuit; and the first and second inductors are sized such that parasitic capacitances of the first and second switches are substantially absorbed by the input and output LC transmission lines.

13 Claims, 6 Drawing Sheets

MUX AND DEMUX CIRCUITS WITH IMPROVED BANDWIDTH

CROSS REFERENCE TO RELATED APPLICATIONS

This application claims priority to and the benefit of U.S. Provisional Patent Application No. 63/214,190, filed Jun. 23, 2021, the disclosure of which is herein incorporated by reference in its entirety.

FIELD

This disclosure relates generally to the field of high-speed multiplexor ("MUX") and demultiplexer ("DEMUX") circuits.

BACKGROUND

A MUX is a combinational logic circuit designed to switch one of several input lines through to a single common output line by the application of a control signal. Conversely, a DEMUX is a combinational logic circuit designed to switch one common input like to one of several separate output lines. Often the output of a digital-to-analog converter (DAC) is input to a MUX, whereas outputs from a DEMUX are often input to separate analog-to-digital converters (DACs).

High-speed MUX and DEMUX circuits are often implemented with field effect transistors (FETs). The parasitic capacitances of the FETs limit the bandwidth the MUX or DEMUX circuit, as the case may be. Multiplexer bandwidth is typically considered as the range of frequencies that are attenuated by less than 3 dB at the drain pin when an input is applied to the source pin of an input channel that is switched on.

SUMMARY

In part, in one aspect, the disclosure relates to combinational circuits, such as multiplexers and demultiplexers, with enhanced bandwidth in comparison to comparable circuits without faster switches and without additional power. A combinational circuit (e.g., multiplexer or demultiplexer) according to embodiments of the present invention can comprise a sub-circuit that comprises first and second current paths from an input of the combinational circuit to an output of the combinational circuit, such that substantially all input current at the input of the combinational circuit is conducted by the sub-circuit via the first and second current paths to the output of the combinational circuit. In various embodiments, the first current path comprises a first inductor and a first switch; and the second current path comprises a second inductor and a second switch. The first inductor is part of an output LC transmission line of the sub-circuit; the second inductor is part of an input LC transmission line of the sub-circuit; and the first and second inductors are sized such that parasitic capacitances of the first and second switches are substantially absorbed by the input and output LC transmission lines. The inductance of the second inductor can substantially equal the inductance of the first inductor. Also, the sub-circuit preferably has insignificant reflection back the input of the combinational circuit. Additionally, the delay, if any, between the first and second current paths can be insignificant or small. In other embodiments, the delay between the first and second current paths can be N one-half clock cycle of a first clock signal for the first switch, and the second switch is switched by the first clock signal time-shifted by N one-half clock cycles, wherein N is integer greater than or equal to 1.

In another general aspect, the disclosure relates a circuit that comprises a N:1 multiplexer (MUX) and N digital-to-analog converters (DACs), with each DAC having an output that is input to the MUX. The MUX selectively connects the output from one of the N DACS to an output of the MUX. The MUX comprises 4N MUX sub-circuits, where each of the MUX sub-circuits comprises first and second current paths from an input of the MUX to an output of the MUX. For each of the 4N MUX sub-circuits: the first current path comprises a first inductor and a first switch; the second current path comprises a second inductor and a second switch; the first inductor is part of an output LC transmission line of the MUX sub-circuit; the second inductor is part of an input LC transmission line of the MUX sub-circuit; and the first and second inductors are sized such that parasitic capacitances of the first and second switches are substantially absorbed by the input and output LC transmission lines.

In yet another general aspect, the disclosure relates to a circuit comprising a 1:N demultiplexer (DEMUX) and N analog-to-digital converters (ADCs), each ADC having an input that is connected to an output of the DEMUX. The DEMUX selectively connects in input of the DEMUX to one of the N ADCs. The DEMUX comprises 4N DEMUX sub-circuits. Each of the 4N DEMUX sub-circuit comprises first and second current paths from an input of the DEMUX to the outputs of the DEMUX. For each of the 4N DEMUX sub-circuits: the first current path comprises a first inductor and a first switch; the second current path comprises a second inductor and a second switch; the first inductor is part of an output LC transmission line of the DEMUX sub-circuit; the second inductor is part of an input LC transmission line of the DEMUX sub-circuit; and the first and second inductors are sized such that parasitic capacitances of the first and second switches are substantially absorbed by the input and output LC transmission lines.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, passivation coatings/layers, optical paths, waveguides, splitters, couplers, combiners, electro-optical devices, inputs, outputs, ports, channels, components and parts of the foregoing disclosed herein can be used with any laser, laser-based communication system, waveguide, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which:

FIG. 5 is a circuit diagram of a MUX sub-circuit according to an exemplary embodiment of the current disclosure.

DETAILED DESCRIPTION

Bandwidth limitations from device parasitic capacitances of a MUX or DEMUX are addressed through various embodiments of the present disclosure by splitting a current path through the MUX or DEMUX, as the case may be, into multiple sections or current paths, with the parasitic capacitances absorbed into LC transmission lines of the MUX/DEMUX. In various embodiments, both the bandwidth (S21) and matching (S22) of the MUX/DEMUX can be nearly doubled without faster switches and without additional power.

Figure 1A:
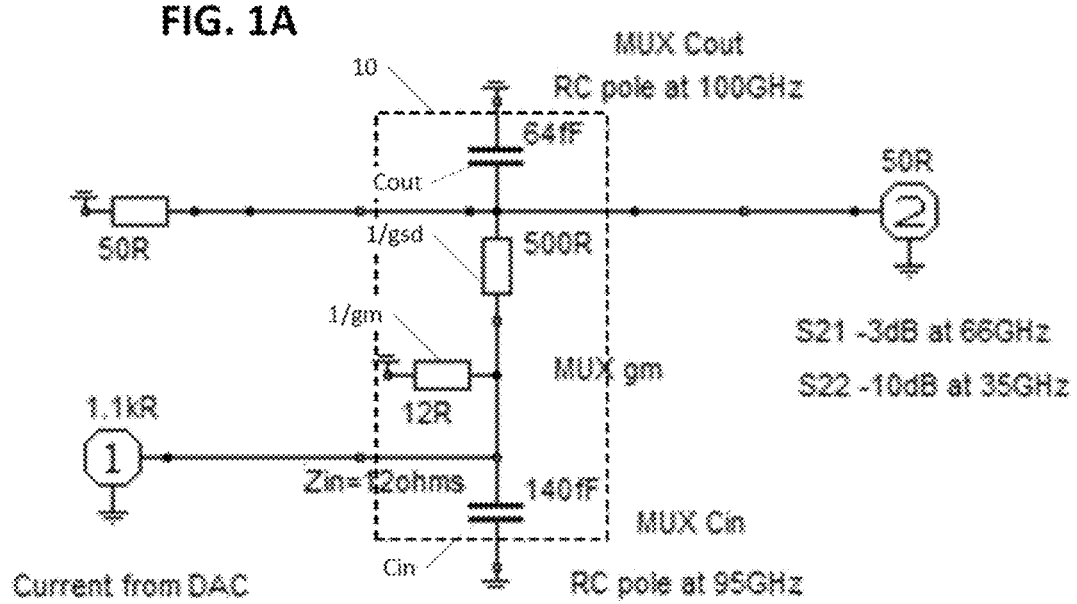
FIG. 1A is a circuit diagram of a conventional MUX.
Figure 1B:
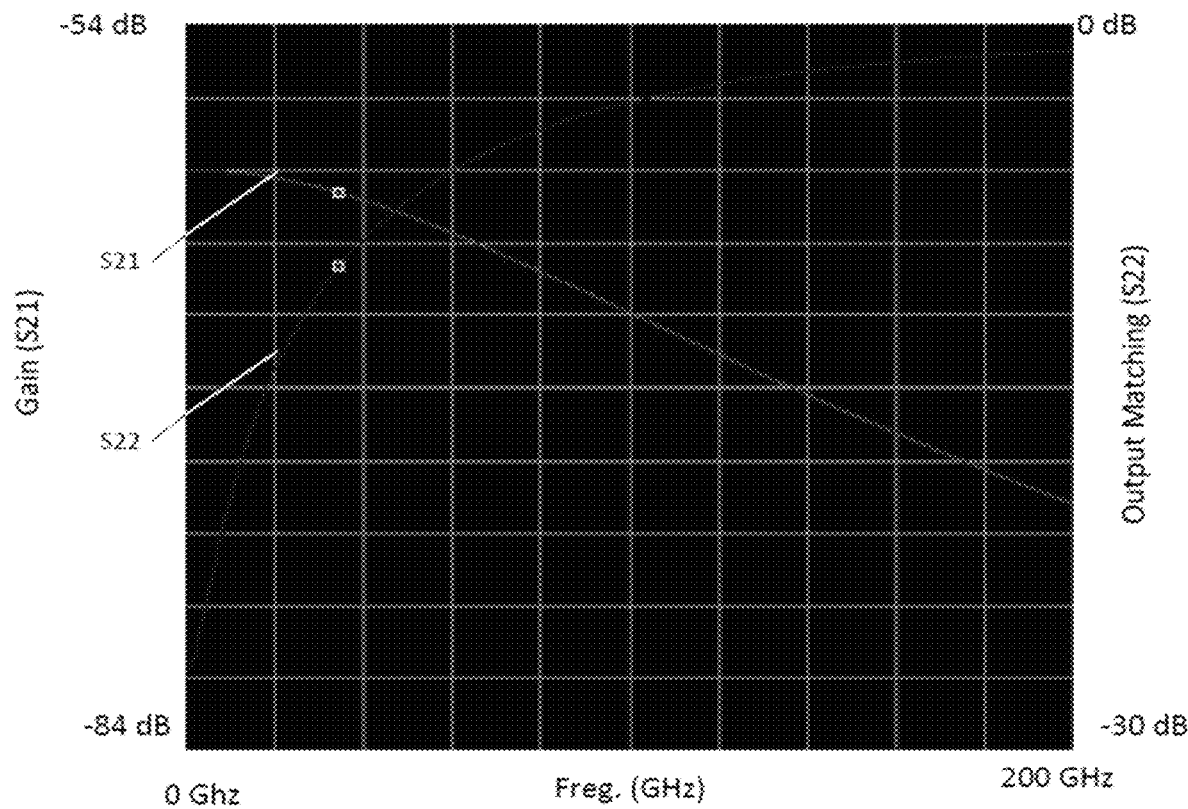
FIG. 1B is a graph showing simulated performance results for the circuit of FIG. 1A.

FIG. 1A is a circuit diagram that models the behavior of a sub-circuit of a conventional MUX. The FET 10 of the MUX is modeled by the input (source) capacitance Cin, a resister (1/gm) that models the transconductance gm of the FET, the output impedance (gds) of the FET, and the output (drain) capacitance Cout. The input current to the MUX is from a DAC, as shown in the lower left. In FIG. 1A, the MUX is connecting the output from the DAC to the output of the MUX and FIG. 1A does not show, for purposes of illustration, any other inputs to the MUX that are multiplexed and another transistor whose input is not selectively connected to the output of the MUX, although the output of the MUX includes the parasitics from the other transistor (this is the case for FIGS. 2A and 3A below too). For the values for Cin, gm, gsd and Cout shown in FIG. 1A, the MUX has a bandwidth (S21) of –3 dB at 66 GHz and an output matching (S22) of –10 dB at 35 GHz. The gain/matching of S21/S22 as a function of frequency for the MUX of FIG. 1A is shown in FIG. 1B.

Figure 2A:
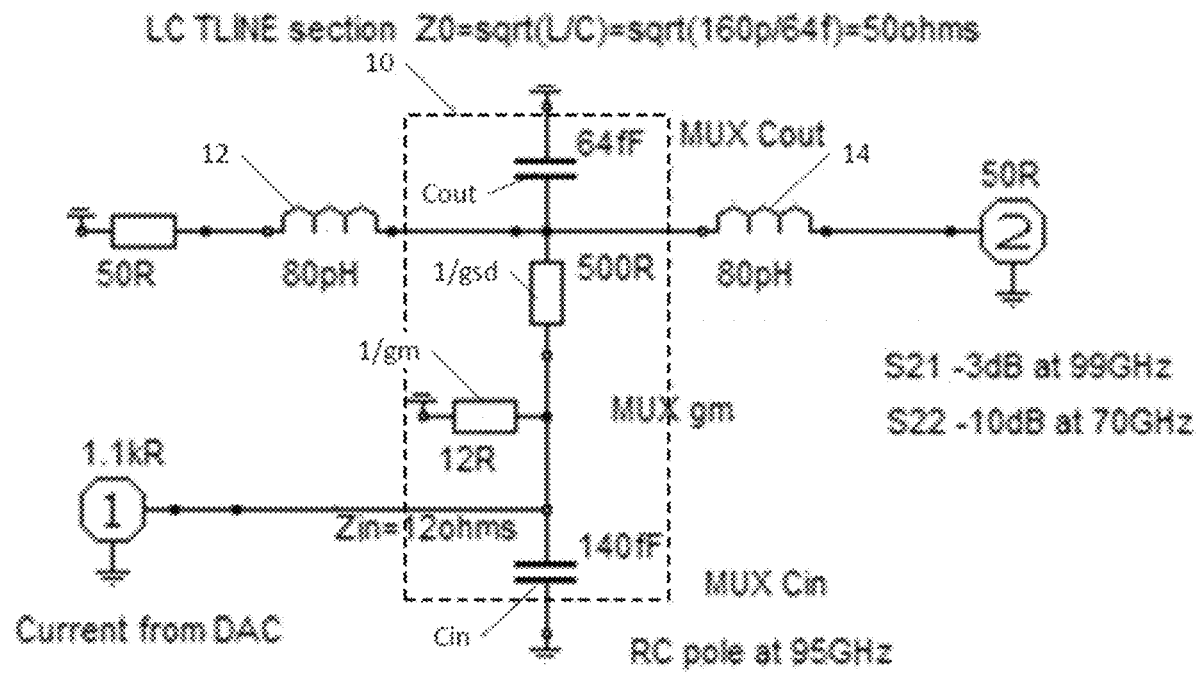
FIG. 2A and FIG. 5 are circuit diagrams of another conventional MUX.
Figure 2B:
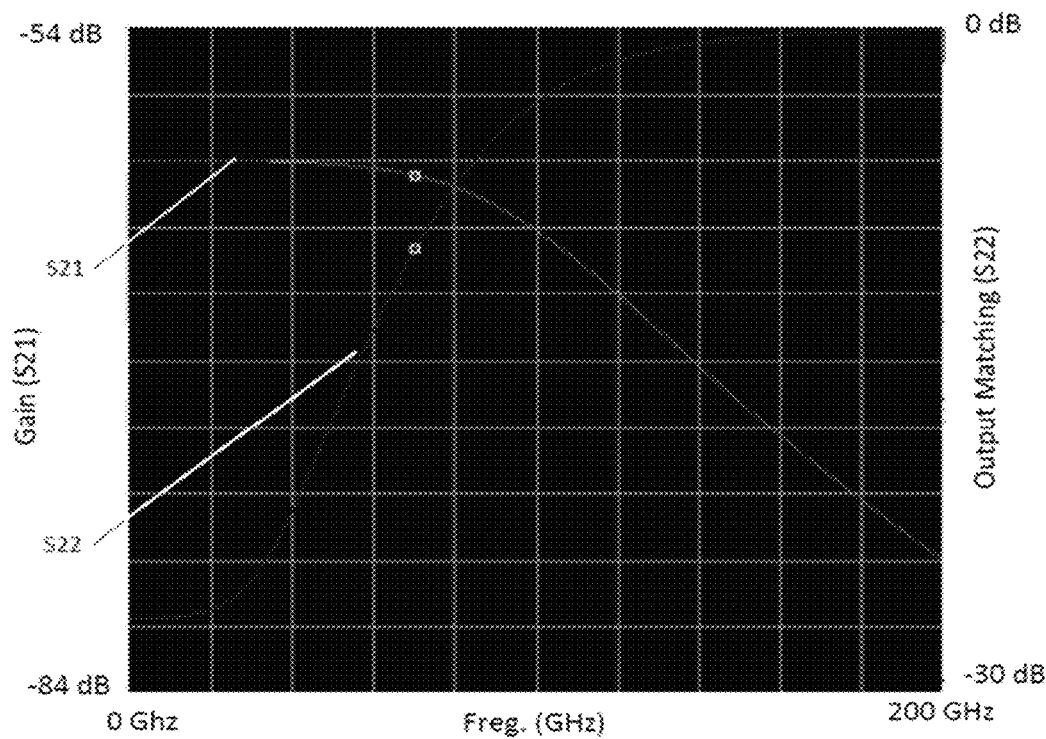
FIG. 2B is a graph showing simulated performance results for the circuit of FIG. 2A.

FIG. 2A is a circuit diagram that models the behavior of a sub-circuit of another conventional MUX. Note that the parameters of the FET 10, e.g., the Cin, gm, gsd and Cout values, are exactly the same as in FIG. 1A. The MUX sub-circuit modeled in FIG. 2A, however, includes the output capacitance of the FET in an inductor-capacitor (LC) transmission line. The use of the inductors 12, 14 increases the bandwidth (S21) to –3 dB at 99 GHz, which is a 50% increase over FIG. 1. The circuit of FIG. 2A has two output inductors 12, 14, each 80 pH in the illustrated example. The output matching (S22) also improves to 10 dB at 70 GHz, which is a 100% improvement over FIG. 1A. In the example embodiment of FIG. 2A, the usable bandwidth (limited by S22) is 70 GHz, which is twice the usable bandwidth of FIG. 1A. The gain/matching of S21/S22 as a function of frequency for the MUX of FIG. 2A is shown in FIG. 2B.

Figure 3A:
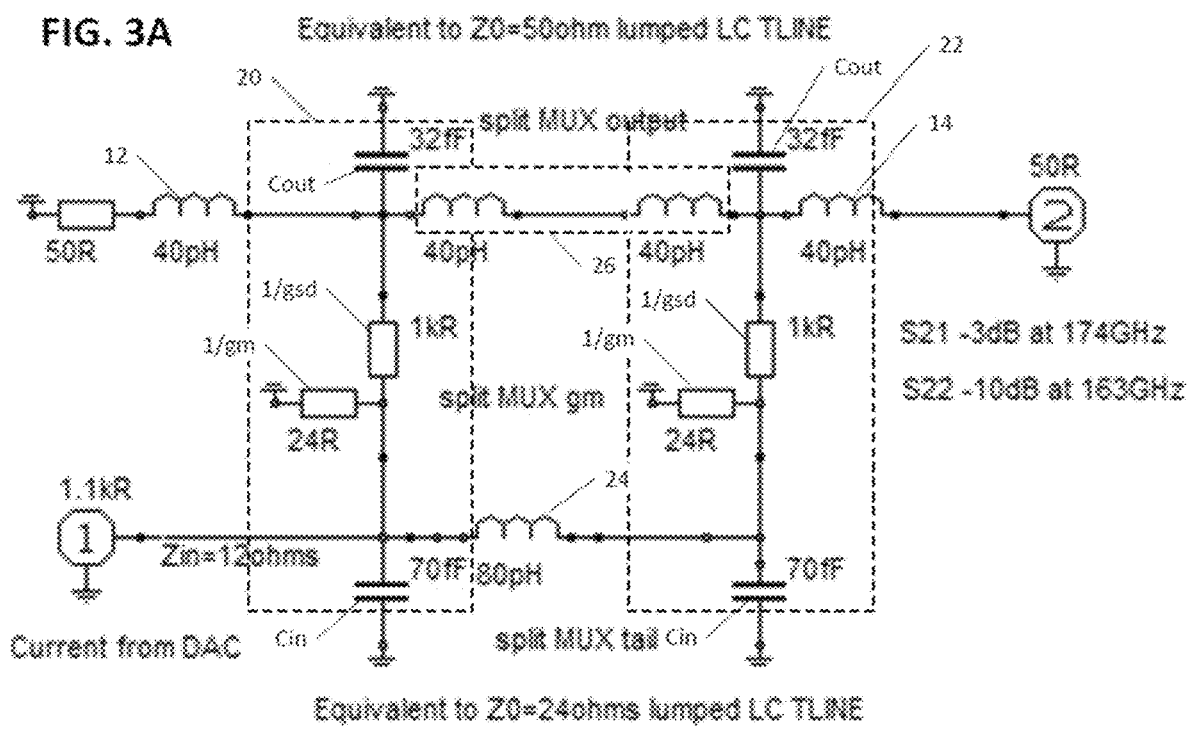
FIG. 3A is a circuit diagram of a MUX sub-circuit according to an exemplary embodiment of the current disclosure.

FIG. 3A is a circuit diagram that models the behavior of a MUX sub-circuit according to an exemplary embodiment of the present invention. The embodiment of FIG. 3A uses two sections, where each section includes a transistor (FET) 20, 22. Note that the capacitance parameters of each FET 20, 22 in FIG. 3A, e.g., the Cin and Cout values, are one-half of the corresponding values of the FET 10 in FIGS. 1A and 2A, and that the impedance parameters of each FET 20, 22 in FIG. 3A, e.g., the 1/gm and 1/gsd values, are twice the corresponding values of the FET 10 in FIGS. 1A and 2A. FIG. 3A also includes an input inductor 24 whose value, 80 pH in this example, is equal to the inductance of each of the output inductors (separately) 12, 14 of FIG. 2A. FIG. 3A also includes a three output inductors. Output inductors 12, 14 are one-half of the values of the corresponding output inductors in FIG. 2A. The third output inductor 26 in this example is equal in value (80 pH) to the input inductor 24 in FIG. 3A. The output inductor 26 could be embodied as two, in series inductors as shown in FIG. 3A. As illustrated in FIG. 3A, the sum of the inductance (160 pH) in the output transmission line in FIG. 3A is the same as in FIG. 2A. In fact, because the output capacitances of the two transistors 20, 22 in FIG. 3A are one-half the output capacitance of the transistor 10 in FIG. 2A, the output impendence Zout of both the MUX in FIG. 2A and the MUX in FIG. 3A is 50 ohms (calculated as square root of L/C). The MUX can provide termination of the inputs signal from the DAC such that substantially all current from the DAC appear at an output of the MUX.

In FIG. 3A, the input LC transmission line, comprising the two 70 fF capacitors and the 80 pH inductor 24, has an impedance 24 ohms. Note that two 70 fF capacitors are, respectively, the source capacitances of the FETs 20, 22. The input impedance from the DAC (in the lower left) is twelve ohms. The input current from the DAC splits into two parts. One part goes into the first MUX section (e.g., FET 20), with an input impedance (1/gm) of 24 ohms, and through the output inductor 26 to the output. The other part goes into the 24 ohm input LC transmission line (with the input inductor 24) and the second MUX section (e.g., FET 22) to the output. This input configuration has a larger bandwidth than FIG. 2A because there is no RC pole at 95 GHz in FIG. 3A as there is in FIG. 2A. Also, in FIG. 3A, the output LC transmission line includes two sections, each with C=32 fF, L=40 pH, for an impedance (Z0) of 50 ohms for each section, which are both matched to 50 ohm. This configuration pushes, at both the input and output sides of the MUX, the parasitic capacitances of the FETs 20, 22 into the input and output transmission lines, which increases the bandwidth of the MUX.

Figure 3B:
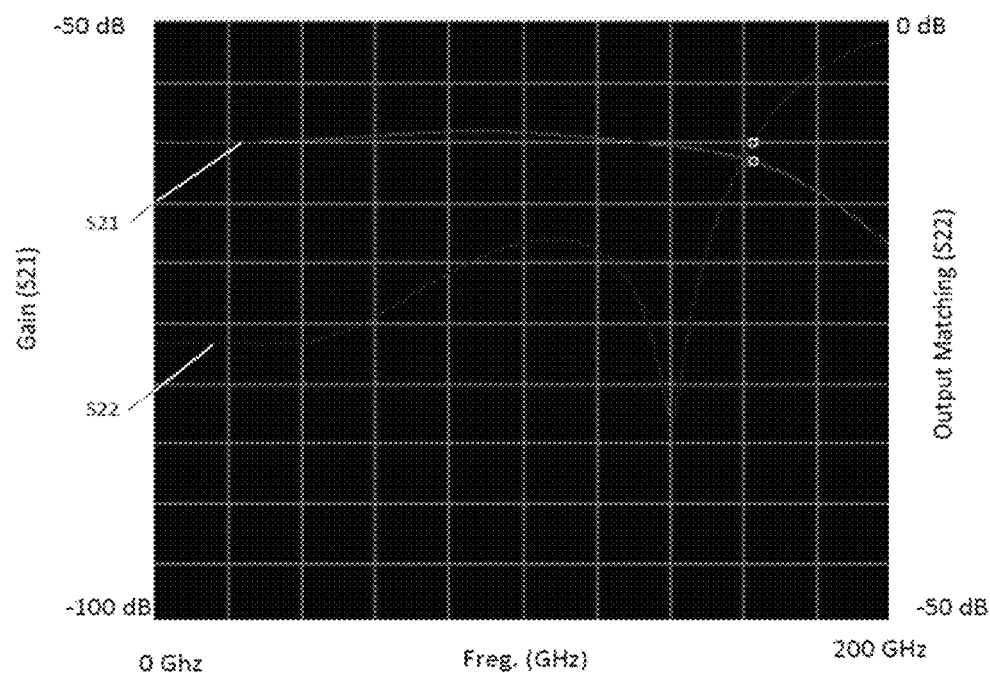
FIG. 3B is a graph showing simulated performance results for the circuit of FIG. 3A.

As shown in FIG. 3B, the bandwidth (S21) in this example is –3 dB at 174 GHz, which is a 75% increase over FIG. 2A. The output matching (S22) is –10 dB at 163 GHz, which is a 130% increase over FIG. 2A. The usable bandwidth (limited by S22) is 163 GHz, which is 2.3 times greater than the example of FIG. 2A. Thus, by using two FETs instead of one FET, where the two FETs collectively have the same parasitic capacitances as the single FET design, and by including the input and output inductors 24, 26 between the split FETs, the MUX provides significant and unexpected performance increases. That is, both the bandwidth (S21) and the matching (S22) can be roughly doubled, without faster FETs and without extra power. Also, assuming that the characteristics of the two FETs 20, 22 are the same (or close), there is no (or small or insignificant) delay between the two paths. And there is no, or small or insignificant, reflectance back from the input, which sees a constant twelve ohm impendence in this example.

In FIG. 3A, the MUX sub-circuit has two sections, e.g., two current paths. In other embodiments, each sections/current paths could be employed.

In certain embodiments, there may be a delay between the two split MUX sections and it may be necessary to delay clocks for controlling the FETs 20, 22 so that the clock and signal delays are similar. In some embodiments, it may be possible to delay a clock using transmission lines with either lumped (LC) or distributed structures. In almost all embodiments, there may be zero power consumption penalty with splitting a MUX as each MUX section may be half the size, carry half the current, and presents half the load to circuits.

Figure 4:
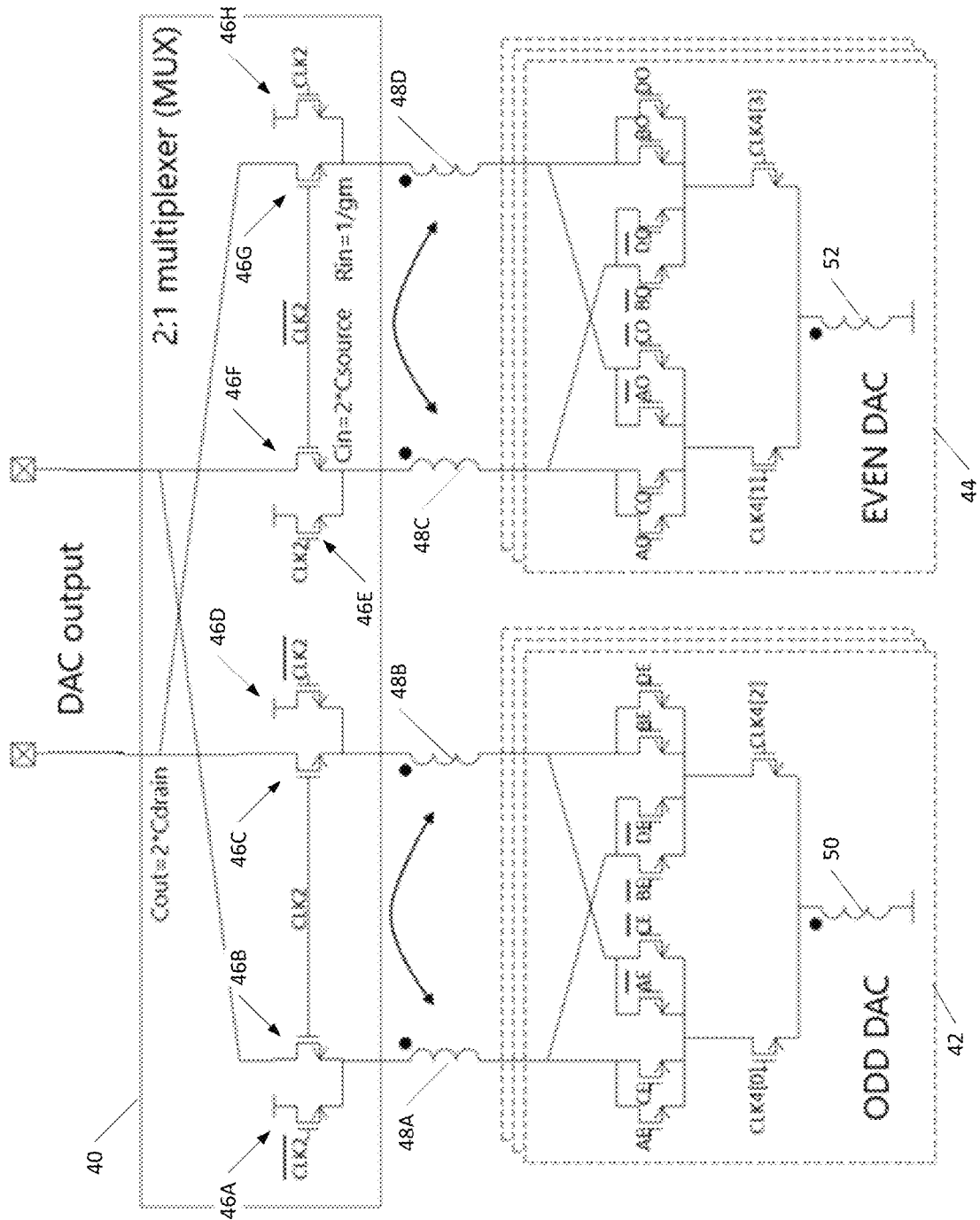
FIG. 4 is diagram of a multiplexer according to an exemplary embodiment of the current disclosure.

FIG. 4 illustrates a N:1 MUX 40, in this example a 2:1 MUX, according to various exemplary embodiments of the present invention. The inputs to the MUX are two DACs, which are denoted in FIG. 4 as Odd DAC 42 and an Even DAC 44. As such, there are four input pins to the MUX 40 (two each from each of the DACs 42, 44) and two outputs. FIG. 4 depicts eight MUX sub-sections 46A-46H denoted as FETs. Each FET in FIG. 4 represents one of the split MUX sub-circuits of FIG. 3A, which includes two FETs 20, 22 and the input and output inductors 24, 26 (which are not shown in FIG. 4, but see FIG. 6 below). Thus, the MUX 40 of FIG. 4 includes eight of the MUX sub-circuit of FIG. 3A, which each MUX sub-circuit comprising two FETs 20, 22, along with the input and output inductors 24, 26.

In the illustrated MUX of FIG. 4, the MUX input impedance Zin is twelve ohms; the MUX input capacitance Cin (computed as two times the source capacitance including parasitic and metal capacitances) is 140 fF, and the MUX output capacitance Cout (computed as two times the drain capacitance including parasitic and metal capacitances) is 64 fF, all corresponding to the same values in FIG. 1A. The FETs 46A-46H are driven by a two-phase clock in the illustrated example. FETs 46B, 46C, 46E and 4H are driven by the same clock signal (CLK2), and the FETs 46A, 46D, 46F and 4G are driven by the inverse clock signal ($\overline{CLK2}$)) CLK2 can be half the output sample rate of the DACs 42, 44. The DACs 42, 44 can have four clock pulses, CLK4[0], CLK4[1], CLK4[2], CLK4[3] to correctly align the Odd and Even DAC outputs with the MUX 40. When CLK2 is high, FETs 46B, 46C, 46E and 46H are on, such that the output of the Odd DAC 42 is steered to the MUX output and the output of the Even DAC 44 is not output by the MUX 40. The MUX can provide termination of the input signals from the odd and even DACs such that substantially all current from the DACs, depending on which one is connected to the output at a given time depending on the clock signals, appears at an output of the MUX.

When the MUX 40 is clocked the source nodes of the FETs 46A-46H may mode up and down together ("common-mode") at the sampling rate, which is twice the frequency of CLK2. This causes the source capacitances at Cin to charge and discharge, and the current needed to do this can distort the MUX output signal. The coupled inductors 48A-D between the MUX 40 and the DACs 42, 44 can be used to tune out this capacitance and to create a high common-mode impedance, which reduces the current which causes distortion. That is, inductor 46A is coupled to inductor 46B, and inductor 46C is coupled to inductor 46D. The inductors 48A-B, 48C-D may be coupled together so that the differential impedance is much lower, so the inductance does not affect the signal from the DACs 42, 44. In some embodiments, the inductors 48A-D may be coupled by wrapping a pair of wires as one inductor. In some embodiment, the coupled inductors may be two coupled wires stacked or interleaved.

In some embodiments, there may be a transmission line between DACs 42, 44 and the MUX 40. In certain embodiments, the transmission line may include a ground shield. In other embodiments, a portion of the transmission line may have a portion of the ground shield removed. In many embodiments, removal of a ground for a section of a transmission line may raise common mode impedance while keeping a low differential impedance, which can be matched to the MUX input impedance Rin.

In many embodiments, the inductors 50, 52 of the DACs 42, 44 respectively may be used to cancel out parasitic capacitance of the clock switching transistors driven by CLK4, which may turn them into a good (high output impedance) current source. In some embodiments, inductors 48A-D tune out common-mode capacitance of the FETs 46A-46H and reduce distortion in the MUX output waveform.

Figure 5:
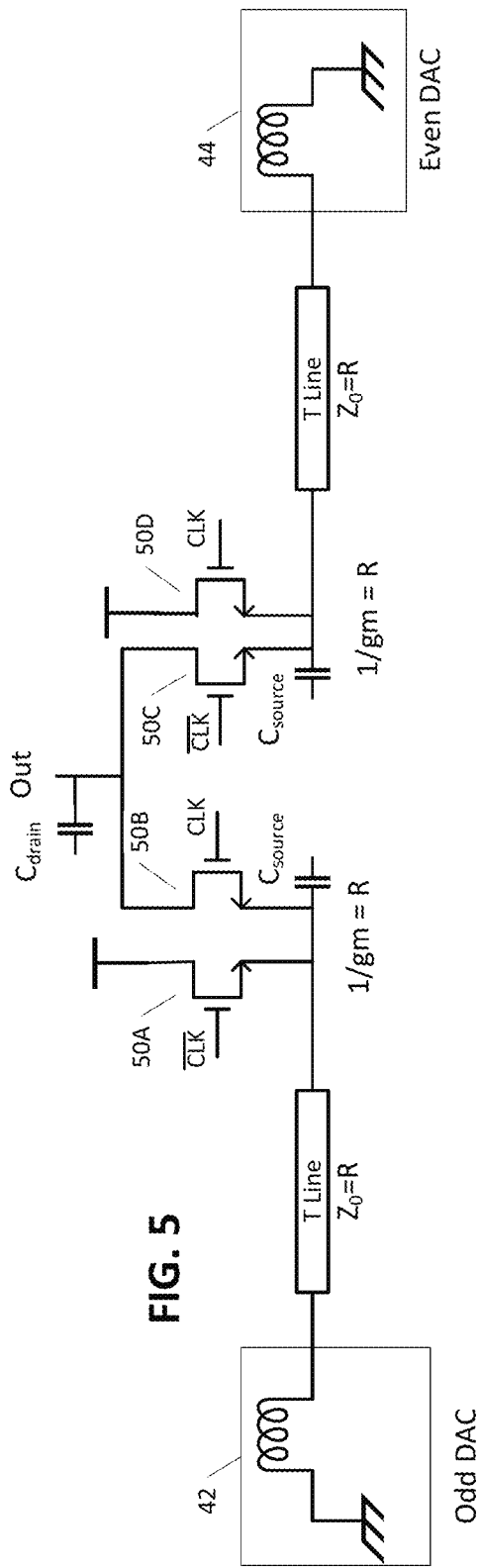
Figure 6:
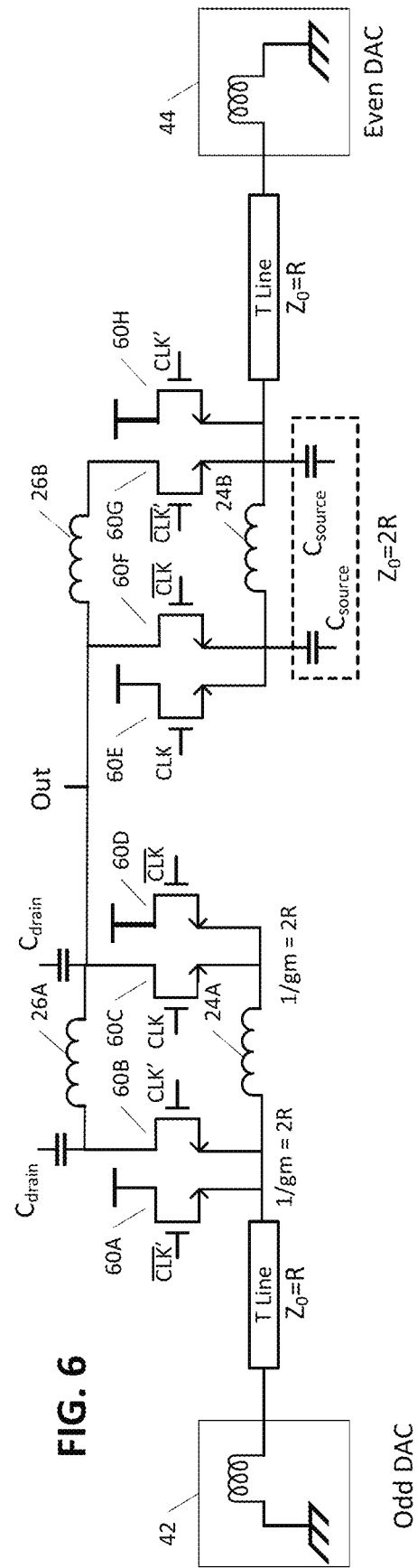
FIG. 6 is a circuit diagram of a MUX sub-circuit according to an exemplary embodiment of the current disclosure.

FIGS. 5 and 6 provide additional clarity for embodiments of the MUX sub-circuits. FIG. 5 shows the conventional MUX sub-circuit of FIG. 2A in more detail. FIG. 5 shows the two inputs DACs (Odd DAC 42 and Even DAC 44). The input from one of the DACs is connected to the output based on the CLK signals to the transistors 50A-50D. Transistors 50B, 50C selectively couple either the Odd DAC or the Even DAC, respectively, to the output. The transistors 50B, 50C correspond to the FET 10 in simplified diagram of FIG. 2A. Note that FIG. 5 does not include the input and output inductors of FIG. 3A (or FIG. 6).

FIG. 6 shows the exemplary split-MUX sub-circuit of FIG. 3A in more detail. FIG. 6 also shows the two inputs DACs (Odd DAC 42 and Even DAC 44), with the input from one of the DACs 42, 44 being connected to the output based on the clock signals for the transistors 60A-60H. FIG. 6 is similar to FIG. 5, except that, for example, switch pair 50A-B in FIG. 5 are separated into switches 60A-D in FIG. 6 with the corresponding input and output inductors 24, 26 as described above. Similarly, switch pair 50C-D in FIG. 5 are separated into switches 60E-H in FIG. 6 with the corresponding input and output inductors 24A-B, 26A-B. When the input from the Odd DAC 42 is connected to the output, switch 60B and inductor 26A provide one current path to the output, and input inductor 24A and switch 60C provide the other current path to the output, as described above in connection with FIG. 3A, depending on the clock signals CLK and CLK'. CLK' could be shifter relative to CLK to account for possible delays in the current paths as described herein. Similarly, when the input from the Even DAC 44 is connected to the output, switch 60G and inductor 26B provide one current path to the output, and input inductor 24B and switch 60F provide the other current path to the output, depending on the clock signals $\overline{CLK}$ and $\overline{CLK'}$.. Note that, as before, the parasitic capacitances (Csource and Cdrain) in FIG. 6 are half the corresponding capacitances of FIG. 5; and the impendences (1/gm) in FIG. 6 are twice the corresponding impendences in FIG. 6. The MUX of FIG. 6 provides approximately twice the bandwidth as the MUX of FIG. 5 as described above.

In both FIG. 5 and FIG. 6, each odd/even DAC 42, 44 has high Rout (current-mode), and their outputs travel down two transmission lines (optional), which are terminated at their far ends by the matched impedance of the MUX input switches (transistor sources).

The bandwidth-enhancing techniques for MUX circuits described above could also be applied to other types of combinational circuits, such as DEMUXs. For example, the N outputs of a 1:N DEMUX could be input to N separate analog-to-digital converters (ADCs), and the DEMUX could use the same bandwidth-enhancing concept but with a reversed signal flow.

Figure 7:
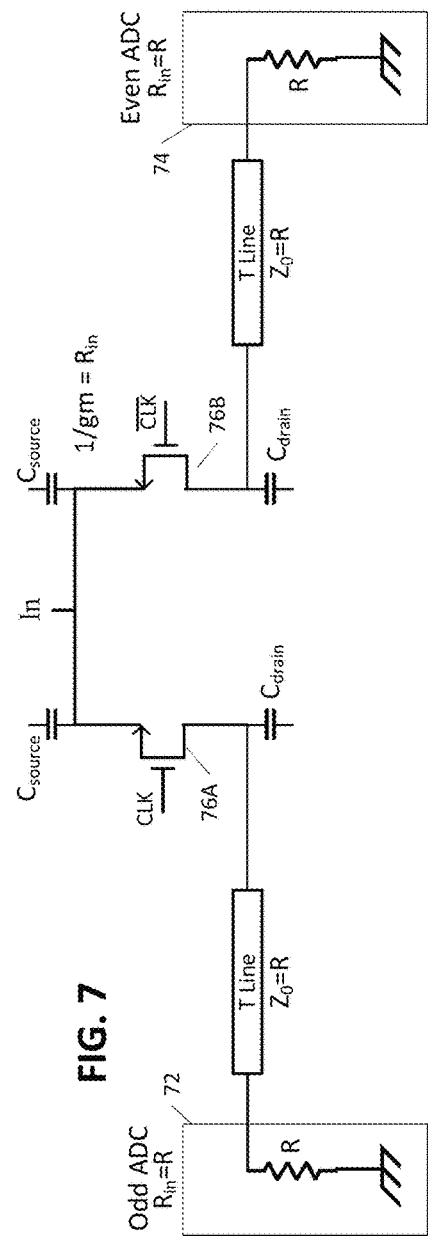
FIG. 7 is a diagram of a conventional DEMUX circuit.

FIG. 7 is a simplified diagram of a DEMUX circuit that does not employ the bandwidth-enhancing techniques of embodiments of the present disclosure. In that sense, the DEMUX of FIG. 7 is similar to the MUX circuit of FIG. 2A. In FIG. 7, the input is coupled to odd and even ADCs 72, 74 by switches 76A-B, respectively. As in FIG. 5, the sources of the switches 76A-B are connected to the input, but the input as at the top of the circuit in FIG. 7, so the sources of the switches 76A-B are at the top of the circuit in the illustration. Switches 76A and 76B are driven inversely, as shown in FIG. 7, in various embodiments. Each switch 76A-B would have a corresponding switch, like switches 50A and 50D in FIG. 5, that are not shown in FIG. 7 for simplicity and that would be driven by the inverse of the clock signal for its corresponding switch.

Figure 8:
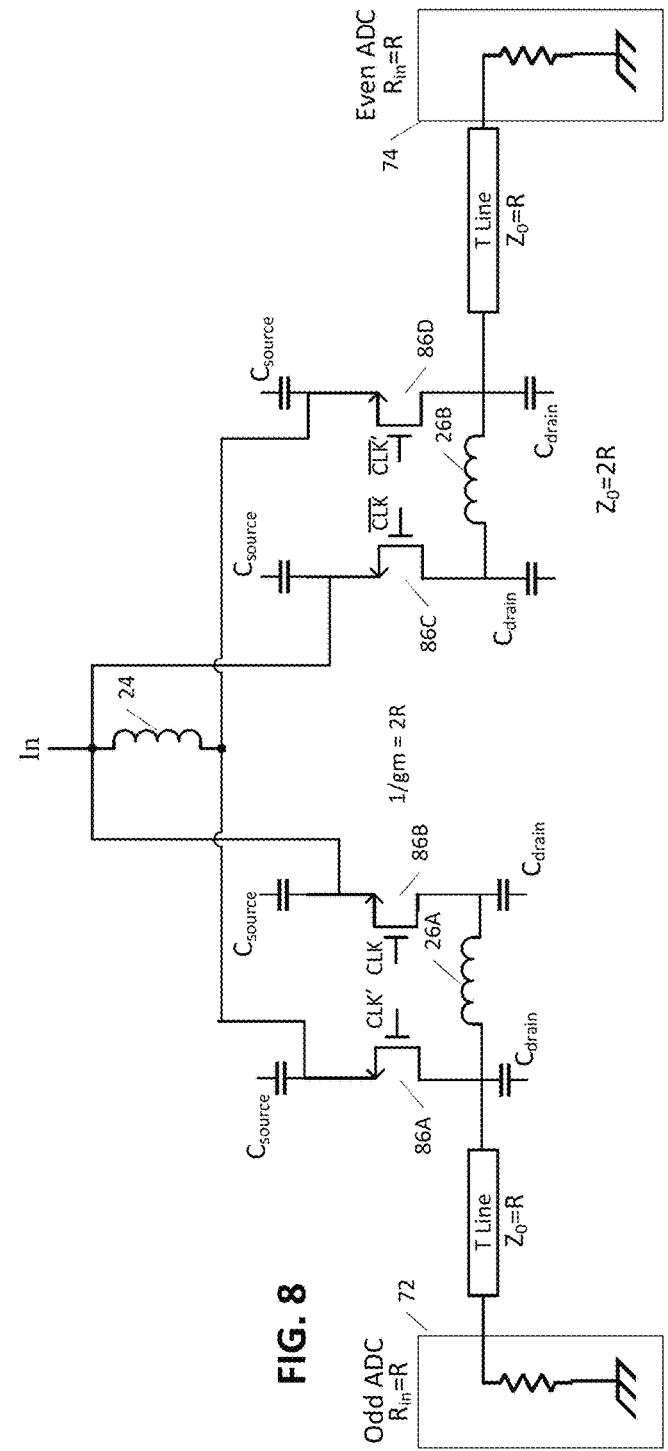
FIG. 8 is a circuit diagram of a DEMUX sub-circuit according to an exemplary embodiment of the current disclosure.

FIG. 8 shows a DEMUX circuit of exemplary embodiments of the present disclosure. The DEMUX circuit of FIG. 8 employs the exemplary bandwidth-enhancing techniques of embodiments of the present disclosure. Like embodiments described above, each switch 76A-B in FIG. 7 is separated into two switches, i.e., switches 86A-D, in FIG. 8. Like in FIG. 7, each switch 86A-D in FIG. 8 has corresponding switches (like switches 60A, 60D, 60E and 60H in FIG. 6) that are not shown for simplicity. The DEMUX circuit of FIG. 8 also includes the input and output inductors 24, 26A-B as described above for the MUX circuits. The illustrative embodiment of FIG. 8 shows a single input inductor 24, although in other embodiments multiple input inductors could be used with a similar cumulative inductive as the single inductor 24 could be employed. Two current paths connect the input to the Odd ADC 72. The first current path includes input inductor 24 and switch 86A; the second current path includes switch 86B and inductor 26A. Similarly, two current paths can connect the input to the Even ADC 74. The first current path includes the input inductor 24 and switch 86D; the second current path includes switch 86C and inductor 26B. The capacitances of the switches 86A-D can be half the capacitances of the switches 76A-B in FIG. 7, and the impedances of the switches 86A-D can be twice the impedances of the switches 76A-B in FIG. 7. This configuration, with the inputs and output inductors 24, 26A-B, can approximately double the bandwidth of the DEMUX in comparison to the conventional DEMUX of FIG. 6, without faster switching switches and without additional power. As shown in FIG. 8, the switches 86A-D can be driven by clock signals, CLK and $\overline{CLK}$,, e.g., where $\overline{CLK}$ is the inverse of CLK. Also, for example, the switches in different current paths, like switches 86A and 86B, can be driven by shifted signals $\overline{CLK}$ and $\overline{CLK'}$, to account for possible delays in the current paths.

In one general aspect, therefore, the present invention is directed to a combinational circuit, such as a multiplexer or a demultiplexer. The combinational circuit comprises a sub-circuit that comprises first and second current paths from an input of the combinational circuit to an output of the combinational circuit, such that substantially all input current at the input of the combinational circuit is conducted by the sub-circuit via the first and second current paths to the output of the combinational circuit. In various embodiments, with reference to FIG. 3A, for example, the first current path comprises a first inductor 26 and a first switch 20; and the second current path comprises a second inductor 24 and a second switch 22. The first inductor 26 is part of an output LC transmission line of the multiplexer sub-circuit; and the second inductor 24 is part of an input LC transmission line of the multiplexer sub-circuit. The first and second inductors 24, 26 are sized such that parasitic capacitances of the first and second switches 20, 22 are substantially absorbed by the input and output LC transmission lines.

In various implementations, an inductance of the second inductor equals and inductance of the first inductor. Also, the sub-circuit can have insignificant reflection (e.g., practically zero) back the input of the combinational circuit. Also, the delay between the first and second current paths can be insignificant (e.g., near zero). In yet other embodiments, the delay between the first and second current paths is N one-half clock cycle of a first clock signal for the first switch, and the second switch is switched by the first clock signal time-shifted by N one-half clock cycles, wherein N is integer greater than or equal to 1.

In another general aspect, the present invention is directed to a circuit that comprises a N:1 multiplexer (MUX) and N digital-to-analog converters (DACs), where each DAC has an output that is input to the MUX. The MUX selectively connects the output from one of the N DACS to an output of the MUX. The MUX comprises 4N MUX sub-circuits. Each MUX sub-circuit comprises first and second current paths from an input of the MUX to an output of the MUX. For each of the 4N MUX sub-circuits: the first current path comprises a first inductor and a first switch; the second current path comprises a second inductor and a second switch; the first inductor is part of an output LC transmission line of the MUX sub-circuit; the second inductor is part of an input LC transmission line of the MUX sub-circuit; and the first and second inductors are sized such that parasitic capacitances of the first and second switches are substantially absorbed by the input and output LC transmission lines.

In various implementations, wherein, for each of the 4N MUX sub-circuits, an inductance of the second inductor equals and inductance of the first inductor. In these or other embodiments, each of the N DACs is connected to the MUX via coupled inductors. Still further, each of the N DACs comprises an input inductor at an input of the DAC. Still further, the MUX can provide termination of the input signals from the DACs such that substantially all current from the DACs appear at an output of the MUX.

In yet another general aspect, the present invention is directed to a circuit that comprises a 1:N demultiplexer (DEMUX) and N analog-to-digital converters (ADCs), where each ADC has an input that is connected to an output of the DEMUX. The DEMUX selectively connects in input of the DEMUX to one of the N ADCs. The DEMUX comprises 4N DEMUX sub-circuits. Each DEMUX sub-circuit comprises first and second current paths from an input of the DEMUX to the outputs of the DEMUX. For each of the 4N DEMUX sub-circuits: the first current path comprises a first inductor and a first switch; the second current path comprises a second inductor and a second switch; the first inductor is part of an output LC transmission line of the multiplexer circuit; the second inductor is part of an input LC transmission line of the multiplexer circuit; and the first and second inductors are sized such that parasitic capacitances of the first and second switches are substantially absorbed by the input and output LC transmission lines. In various implementations, for each of the 4N DEMUX sub-circuits, an inductance of the second inductor equals and inductance of the first inductor.

The DAC/ADC bandwidth may be a limiting factor for optical transceiver designs. Being able to approximately double this bandwidth in the same technology node and with no increase in power consumption, as described herein, may be significant and valuable.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

What is claimed is:

1. A combinational circuit that is one of a multiplexer or demultiplexer, the combinational circuit comprising a sub-circuit that comprises first and second current paths from an input of the combinational circuit to an output of the combinational circuit, such that substantially all input current at the input of the combinational circuit is conducted by the sub-circuit via the first and second current paths to the output of the combinational circuit, wherein:
    the first current path comprises a first inductor and a first switch; and
    the second current path comprises a second inductor and a second switch;
    the first inductor is part of an output LC transmission line of the sub-circuit;
    the second inductor is part of an input LC transmission line of the sub-circuit; and
    the first and second inductors are sized such that parasitic capacitances of the first and second switches are substantially absorbed by the input and output LC transmission lines.

2. The combinational circuit of claim 1, wherein the inductance of the second inductor substantially equals the inductance of the first inductor.

3. The combinational circuit of claim 1, wherein the sub-circuit has insignificant reflection back the input of the combinational circuit.

4. The combinational circuit of claim 1, wherein a delay between the first and second current paths is small.

5. The combinational circuit of claim 1, wherein a delay between the first and second current paths is N one-half clock cycle of a first clock signal for the first switch, and the second switch is switched by the first clock signal time-shifted by N one-half clock cycles, wherein N is integer greater than or equal to 1.

6. A circuit comprising:
    a N:1 multiplexer (MUX); and
    N digital-to-analog converters (DACs), each having an output that is input to the MUX,
    wherein:
        the MUX selectively connects the output from one of the N DACS to an output of the MUX;
        the MUX comprises 4N MUX sub-circuits; and
        each of the MUX sub-circuits comprises first and second current paths from an input of the MUX to an output of the MUX; and
        wherein, for each of the 4N MUX sub-circuits:
            the first current path comprises a first inductor and a first switch;

the second current path comprises a second inductor and a second switch;

the first inductor is part of an output LC transmission line of the MUX sub-circuit;

the second inductor is part of an input LC transmission line of the MUX sub-circuit; and the first and second inductors are sized such that parasitic capacitances of the first and second switches are substantially absorbed by the input and output LC transmission lines.

7. The circuit of claim 6, wherein, for each of the 4N MUX sub-circuits, the inductance of the second inductor substantially equals the inductance of the first inductor.

8. The circuit of claim 6, wherein each of the N DACs is connected to the MUX via coupled inductors.

9. The circuit of claim 8, wherein each of the N DACs comprises an input inductor at an input of the DAC.

10. The circuit of claim 6, wherein each of the N DACs comprises an input inductor at an input of the DAC.

11. The circuit of claim 6, wherein the MUX provides termination of input signals from the DACs such that substantially all current from the DACs appear at an output of the MUX.

12. A circuit comprising:

a 1:N demultiplexer (DEMUX); and

N analog-to-digital converters (ADCs), each having an input that is connected to an output of the DEMUX, wherein:

the DEMUX selectively connects in input of the DEMUX to one of the N ADCs;

the DEMUX comprises 4N DEMUX sub-circuits; and each 4N DEMUX sub-circuits comprises first and second current paths from an input of the DEMUX to the outputs of the DEMUX; and wherein, for each of the 4N DEMUX sub-circuits:

the first current path comprises a first inductor and a first switch;

the second current path comprises a second inductor and a second switch;

the first inductor is part of an output LC transmission line of the DEMUX sub-circuit;

the second inductor is part of an input LC transmission line of the DEMUX sub-circuit; and the first and second inductors are sized such that parasitic capacitances of the first and second switches are substantially absorbed by the input and output LC transmission lines.

13. The circuit of claim 12, wherein, for each of the 4N DEMUX sub-circuits, the inductance of the second inductor substantially equals the inductance of the first inductor.

\* \* \* \* \*